US009477217B2

(12) United States Patent
Gardner et al.

(10) Patent No.: US 9,477,217 B2
(45) Date of Patent: Oct. 25, 2016

(54) USING VISUAL CUES TO IMPROVE APPLIANCE AUDIO RECOGNITION

(71) Applicant: General Electric Company, Schenectady, NY (US)

(72) Inventors: William Everette Gardner, Louisville, KY (US); Joel Erik Hitzelberger, Louisville, KY (US)

(73) Assignee: Haier US Appliance Solutions, Inc., Wilmington, DE (US)

( * ) Notice: Subject to any disclaimer, the term of this patent is extended or adjusted under 35 U.S.C. 154(b) by 350 days.

(21) Appl. No.: 14/198,770

(22) Filed: Mar. 6, 2014

(65) Prior Publication Data
US 2015/0254053 A1    Sep. 10, 2015

(51) Int. Cl.
*G05B 15/02*     (2006.01)
*H03G 3/04*      (2006.01)
*G10L 21/0208*   (2013.01)
*G06F 3/16*      (2006.01)
*G10L 15/22*     (2006.01)

(52) U.S. Cl.
CPC .............. *G05B 15/02* (2013.01); *G06F 3/167* (2013.01); *H03G 3/04* (2013.01); *G10L 21/0208* (2013.01); *G10L 2015/223* (2013.01)

(58) Field of Classification Search
CPC ................... G11B 20/10527; G10L 21/0208; G10L 2015/223; H05K 999/99
See application file for complete search history.

(56) References Cited

U.S. PATENT DOCUMENTS

| 2007/0014420 A1* | 1/2007 | Brown ................. H04R 27/00 381/110 |
| 2007/0049230 A1* | 3/2007 | Hendrix .............. H03G 3/3052 455/296 |
| 2009/0240496 A1* | 9/2009 | Yamamoto ............. G10L 15/20 704/233 |
| 2011/0230235 A1* | 9/2011 | Jan .................... H04M 1/72569 455/557 |
| 2012/0072221 A1* | 3/2012 | White .................. G10L 15/30 704/251 |
| 2012/0232903 A1* | 9/2012 | Cenedese ............ A47L 15/4293 704/246 |
| 2014/0169581 A1* | 6/2014 | Osako .................. H04N 9/806 381/73.1 |
| 2014/0270194 A1* | 9/2014 | Des Jardins ........ G10L 21/0224 381/56 |

FOREIGN PATENT DOCUMENTS

| CN | 102932212 A | 2/2013 |
| EP | 1624447 A2 | 2/2006 |

* cited by examiner

*Primary Examiner* — Charles E Anya
(74) *Attorney, Agent, or Firm* — Dority & Manning, P.A.

(57) ABSTRACT

Appliance systems and methods for using visual cues to improve appliance audio recognition are provided. One example method performed by an appliance includes identifying one or more visual cues included in imagery captured by a camera of the appliance. The one or more visual cues indicate that a user of the appliance is seeking to provide a voice command to the appliance. The method includes communicating with one or more devices over a network to reduce background noise associated with the one or more devices upon identifying the one or more visual cues. The method includes receiving the voice command from the user. The method includes determining that the user has finished providing the voice command. The method includes communicating with the one or more devices over the network to resume standard operations upon determining that the user has finished providing the voice command.

16 Claims, 3 Drawing Sheets

USING VISUAL CUES TO IMPROVE APPLIANCE AUDIO RECOGNITION

FIELD OF THE INVENTION

The present disclosure relates generally to appliances. More particularly, the present disclosure relates to appliance systems and methods of operation for using visual cues to improve appliance audio recognition.

BACKGROUND OF THE INVENTION

Recent advancements in the ability of computing systems to recognize and understand human speech has led to the increased use and availability of computer-based personal assistants or other speech-interactive computing systems. In particular, certain "smart" appliances are beginning to incorporate advanced features able to directly respond to user voice requests. For example, an appliance (e.g. a refrigerator) can perform a requested action or operation in response to a voice request.

However, from the user's perspective, the increasing presence of such feature-rich appliances can undesirably increase the complexity of interacting with an appliance. Thus, a challenge presented by such recent advancements is to provide advanced appliance features without burdening the user with onerous interaction with the technology.

As an example, speech technology used in connection with a phone or in a car is typically initiated in a push to talk method, in which a user presses a button or provides another physical indication to the device that the user is about to give a speech command. However, in the context of appliances, push to talk is problematic, as the user may have their hands occupied with kitchen tasks such as stirring or chopping. In addition, a user handling food such as raw meats may find it undesirable to have hand contact with the appliance.

As another example, instead of using push to talk, some speech recognition systems employ a wake up word, in which the user utters a particular word or phrase to indicate that the user is preparing to provide a speech command. However, speech recognition systems employing a wake up word are vulnerable to false positives, in which background noise such as an ambient conversation causes the system to incorrectly wake up and attempt to respond.

The above noted problems with wake up words are particularly problematic in the context of the home kitchen, which has long been a center of activity of a household. In particular, modern kitchens can be subject to many background noises, such as a television, music player, conversation, appliance mechanical operation noises, or other background noise. Thus, the use of wake up words in the kitchen context can be undesirable.

Furthermore, background noise in the kitchen or other home environment is a problem that continues even after recognition that the user is providing a voice command. In particular, background noise can interfere with reception and processing of the voice command. For example, if the user voice command is not clearly audible over the background noise, then the speech recognition system can have difficulty processing the received audio signal.

Therefore, systems and methods for improving speech command identification and analysis are desirable. In particular, systems and methods that use visual cues to improve speech command recognition are desirable.

BRIEF DESCRIPTION OF THE INVENTION

Additional aspects and advantages of the invention will be set forth in part in the following description, or may be apparent from the description, or may be learned through practice of the invention.

One aspect of the present disclosure is directed to a method of operating an appliance. The method includes identifying, by the appliance, one or more visual cues included in imagery captured by a camera of the appliance. The one or more visual cues indicate that a user of the appliance is seeking to provide a voice command to the appliance. The method includes communicating, by the appliance, with one or more devices over a network to reduce background noise associated with the one or more devices upon identifying the one or more visual cues. The method includes receiving, by the appliance, the voice command from the user. The method includes determining, by the appliance, that the user has finished providing the voice command. The method includes communicating, by the appliance, with the one or more devices over the network to resume standard operations upon determining that the user has finished providing the voice command.

Another aspect of the present disclosure is directed to a system. The system includes one or more devices connected over a network. The system includes an appliance connected to the network. The appliance includes a camera for capturing visual imagery. The appliance also includes a microphone, a processor, and a memory storing instructions that, when executed by the processor, cause the appliance to perform operations. The operations include analyzing the visual imagery to determine when a user is attempting to provide the appliance with a voice command. The operations include, when it is determined that the user is attempting to provide the appliance with the voice command, communicating with the one or more devices over the network to cause the one or more devices to decrease a volume of an audio output the one or more devices are respectively outputting. The method includes receiving the voice command from the user after communicating with the one or more devices over the network to cause the one or more devices to decrease a volume of an audio output the one or more devices are respectively outputting.

Another aspect of the present disclosure is directed to an appliance. The appliance includes a camera for capturing visual imagery. The appliance includes a microphone. The appliance includes means for performing operations. The operations include analyzing the visual imagery to determine when a user is attempting to provide the appliance with a voice command. The operations include communicating over a network to identify one or more devices that are generating background noise when it is determined that the user is attempting to provide the appliance with the voice command. The operations include reducing the background noise generated by the one or more devices. The operations include receiving the voice command from the user.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Figure 1:
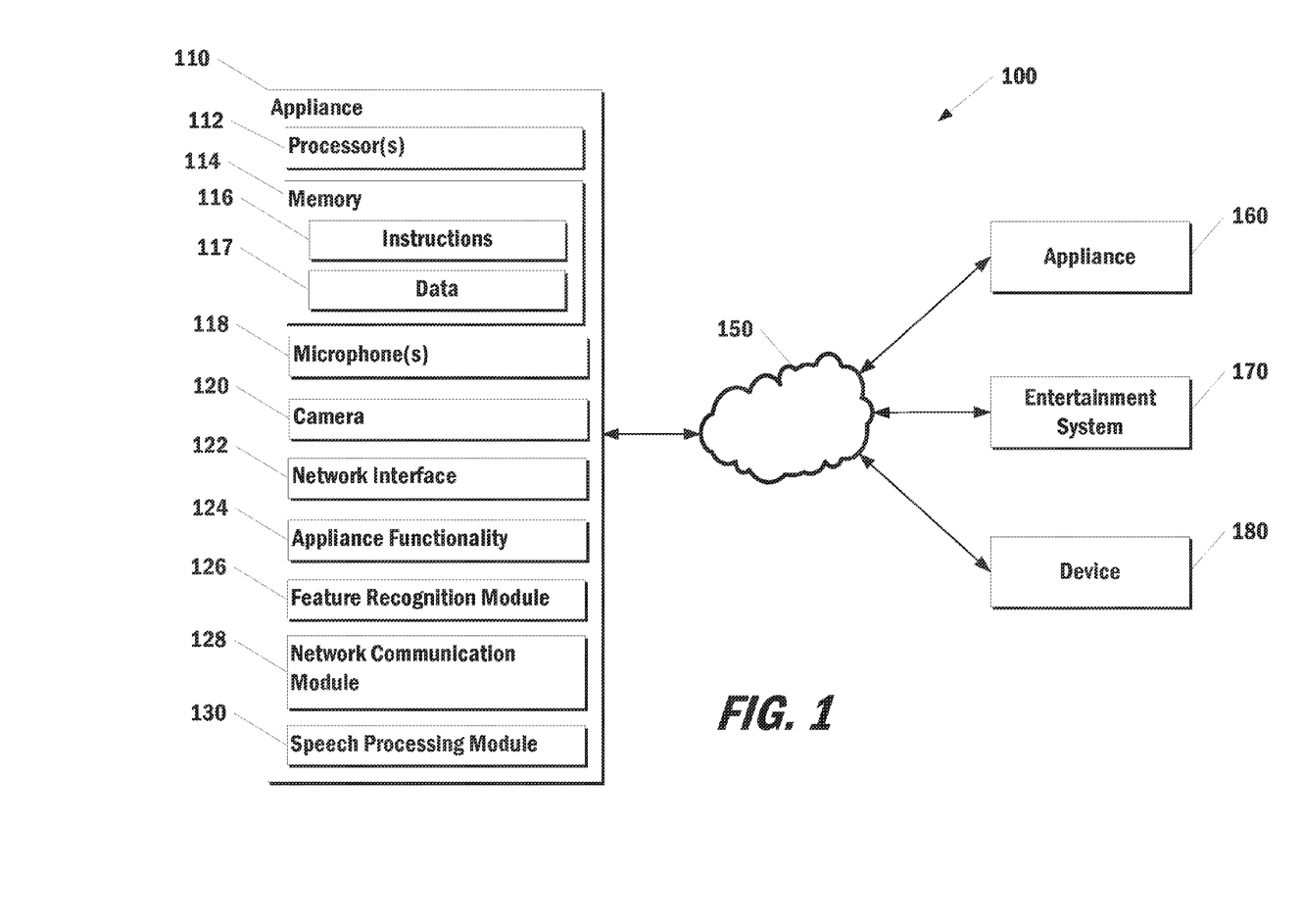
FIG. 1 depicts an example system according to an example embodiment of the present disclosure.

With reference now to the FIGS., example embodiments of the present disclosure will be discussed in further detail. FIG. 1 depicts an example system 100 according to an example embodiment of the present disclosure. System 100 can include an appliance 110 connected to a network 150.

Appliance 110 can include one or more processors 112 and a memory 114. The processor(s) 112 can be any suitable processing device, such as a microprocessor, microcontroller, integrated circuit, or other suitable processing device. Appliance 110 can be any suitable type of appliance, including, but not limited to, a dishwasher, a microwave, a washing machine, a dryer, an oven, a refrigerator, a heater, a home energy manager, or any other type of appliance.

The memory 114 can include any suitable storage media, including, but not limited to, non-transitory computer-readable media, RAM, ROM, hard drives, flash drives, accessible databases, or other memory devices. The memory 114 can store information accessible by processor(s) 112, including instructions 116 that can be executed by processor(s) 112 to control various components of appliance 110 to provide appliance functionality 124. Memory 114 can also store various forms of other data 117.

Appliance 110 can also include one or more microphone(s) 118 and a camera 120. Microphone(s) 118 can be any device or component for receiving audio signals. Thus, the microphones 118 can be a means for receiving a voice command from a user. Camera 120 can be any component for capturing visual imagery.

Appliance 110 can also include a network interface 122. Network interface 122 can include and components, devices, or circuitry for directing communications over network 150. For example, network interface 122 can include a modem, router, transceiver, and/or other communication components and associated circuitry.

Network 150 can be any type of communications network, such as a local area network (e.g. intranet), wide area network (e.g. Internet), or some combination thereof. In general, communication over network 150 can be carried using any type, number, or combination of wired and/or wireless connections, using a variety of wireless technologies (e.g. WiFi, Bluetooth, and/or ZigBee), communication protocols (e.g. TCP/IP, HTTP, SMTP, FTP), encodings or formats (e.g. HTML, XML), and/or protection schemes (e.g. VPN, secure HTTP, SSL). It will be understood that network 150 may be representative of several independent networks that use different communication technologies.

Appliance 110 can also include a feature recognition module 126, a network communication module 128, and a speech processing module 130.

It will be appreciated that the term "module" refers to computer logic utilized to provide desired functionality. Thus, a module can be implemented in hardware, firmware and/or software controlling a general purpose processor. In one embodiment, the modules are program code files stored on the storage device, loaded into memory and executed by a processor or can be provided from computer program products, for example, computer executable instructions that are stored in a tangible computer-readable storage medium such as RAM hard disk or optical or magnetic media.

Appliance 110 can implement feature recognition module 126 to recognize one or more features in imagery captured by camera 120. For example, feature recognition module 126 can be implemented to recognize human facial features such as human eyes, human lips, human faces, or other features. Furthermore, feature recognition module can compare features detected over several frames of captured imagery to identify changes in features such as, for example, a prolonged gaze or eye contact, moving lips, or other changes in features. Thus, in some implementations, feature recognition module 126 can be a means for analyzing visual imagery to determine when a user is attempting to provide the appliance with a voice command.

Appliance 110 can implement network communication module 128 to direct communications over network 150 via network interface 122. For example, an additional appliance 160, an entertainment system 170, and a device 180 can also be connected to network 150. Network communication module 128 can be implemented to communication with appliance 160, entertainment system 170, and device 180 over network 150. Thus, in some implementations, network communication module 128 can be a means for communicating over a network to identify one or more devices that are generating background noise and to reduce the background noise generated by the one or more devices.

Appliance 110 can implement speech processing module 130 to process an audio signal containing a voice command received from a user. For example, speech processing module 130 can identify tokens, sentence structure, objects, verbs, or other forms of speech processing.

In some further embodiments, speech processing module can filter from the audio signal certain identified audio frequencies. Thus, in such implementations, speech processing module 130 can be a means for filtering from the audio signal one or more audio frequencies associated with one or more devices that are generating background noise.

Furthermore, although modules 126, 128, and 130 are shown in FIG. 1 as being included in appliance 110, it will be recognized that, in some embodiments, one or more of modules 126, 128, and 130 can be provided by a server computing device accessed over network 150.

In addition, appliance 160, entertainment system 170, and device 180 connected to network 150 are provided as example devices that may be communicated with over network 150 by appliance 110. Many other different and various devices or machines can be connected to network 150 and communicated with and/or controlled by appliance 110.

Figure 2:
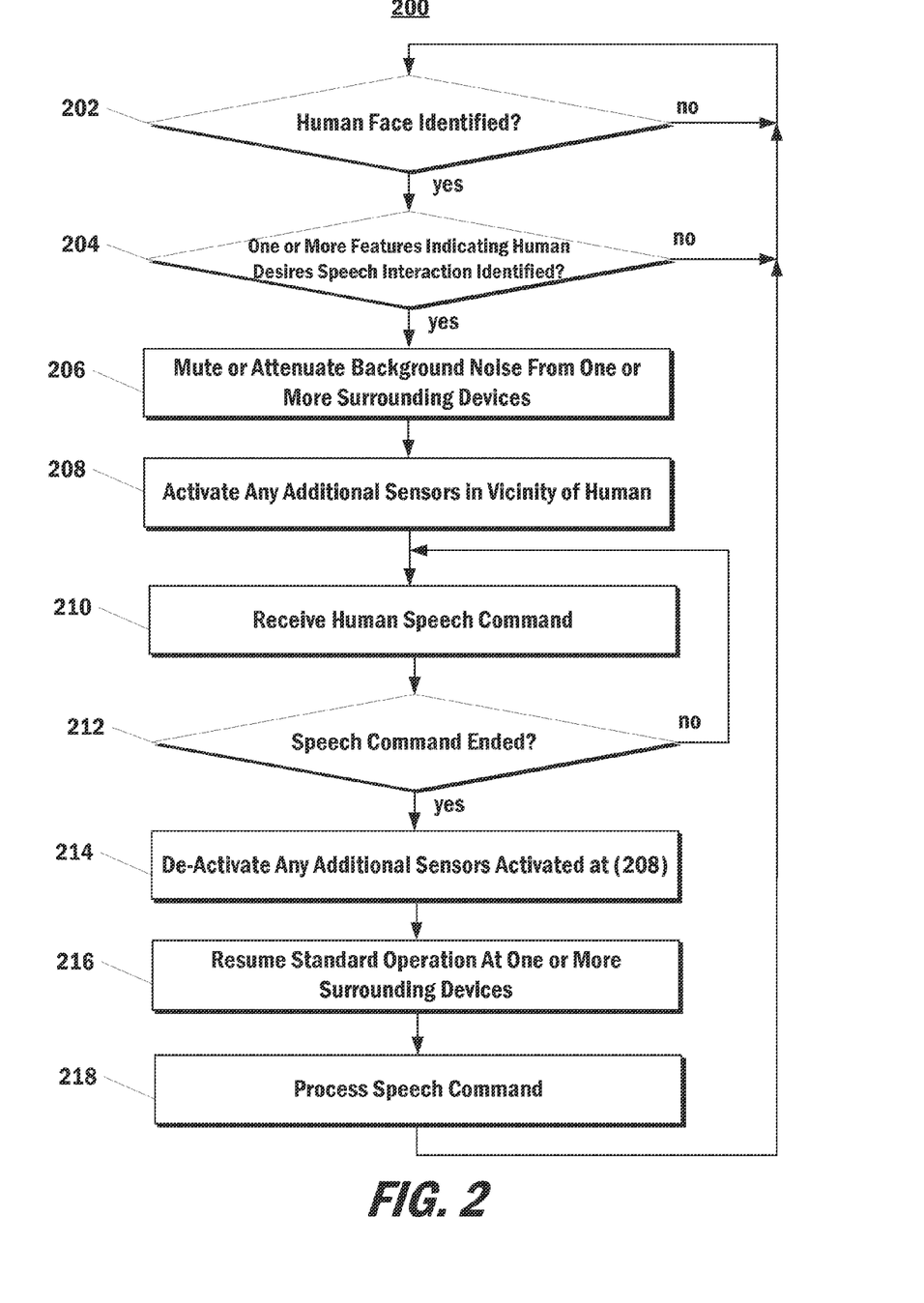
FIG. 2 depicts a flow chart of an example method of operating an appliance according to an example embodiment of the present disclosure.

FIG. 2 depicts a flow chart of an example method (200) of operating an appliance according to an example embodiment of the present disclosure. Although method will be discussed with reference to system 100 of FIG. 1, method (200) can be performed by any suitable appliance system.

In addition, FIG. 2 depicts steps performed in a particular order for purposes of illustration and discussion. Those of ordinary skill in the art, using the disclosures provided herein, will understand that the various steps of method (200) can be omitted, adapted, and/or rearranged in various ways without departing from the scope of the present disclosure.

At (202) it can be determined whether a human face has been identified. For example, camera 120 can collect one or more frames of visual imagery. Feature recognition module 126 can be implemented to analyze the one or more frames of visual imagery to identify the presence or absence of human facial features.

If it is determined at (202) that a human face has not been identified, then method (200) can perform (202) again. For example, additional frames of imagery can be captured and then analyzed. However, if it is determined at (202) that a human face has been identified, then method (200) can proceed to (204).

At (204) it can be determined whether one or more features indicating that the human desires speech interaction have been identified. For example, feature recognition module 126 can analyze the frames of imagery to identify whether they contain one or more features indicating that the human desires speech interaction.

As an example, the one or more features identified at (204) can include a prolonged gaze or eye contact with the appliance. For example, if greater than a threshold number of consecutive frames of visual imagery contain human eye features then it can be assumed at (204) that the human desires speech interaction.

As another example, the one or more features identified at (204) can include moving lips of a human. Thus, if the imagery includes lip features that are moving (e.g. displaced) over a number of consecutive frames than it can be assumed that the human is speaking and therefore desires speech interaction with the appliance.

If it is determined at (204) that one or more features indicating that the human desires speech interaction have not been identified, then method (200) can return to (202). However, if it is determined at (204) that one or more features indicating that the human desires speech interaction have been identified, then method (200) can proceed to (206).

At (206) background noise from one or more surrounding devices can be muted or attenuated. For example, the appliance can query any networked devices to identify which of such devices are operating and generating background noise.

As an example, at (206) the network communication module 128 can communicate with one or more devices (e.g. entertainment system 170) over network 150 and instruct the devices to mute or attenuate their respective audio outputs. For example, a television or music player can be switched to mute or attenuated.

As another example, at (206) the network communication module 128 can communicate with one or more devices over network 150 to instruct the one or more devices to discontinue operating one or more components that generate noise. For example, appliance 160 can include a fan or compressor that generates background noise when it is operating. Therefore, at (206) appliance 110 can communicate with appliance 160 over network 150 to discontinue operation of the fan or compressor so that the human speech signal can be received.

At (208) any additional sensors within the vicinity of the human can be activated. For example, in some embodiments, appliance 110 may not have a microphone 118. In such embodiments, the appliance 110 can communicate with other networked devices to turn on microphones located at such devices.

In other embodiments, appliance 110 may have plural microphones, and at (208) the appliance can activate one or more of the microphones to receive the human speech command. In particular, the appliance can turn on the particular microphones that are located approximate to the position of the user as indicated by the visual imagery.

In yet other embodiments, appliance 110 may have stored in data 117 a mapping of networked devices that describes the relative positions of the devices with respect to appliance 100. Thus, in such embodiments, at (208) appliance 110 can consult the mapping to identify the microphones or other sensors that are best positioned to receive a speech command from the user.

At (210) the human speech command can be received. For example, appliance 110 can receive an audio signal using microphones 118 and then store the received audio signal in memory.

In other embodiments, receiving the human speech command at (210) can include receiving a plurality of audio signals from a plurality of different sensors that were activated at (208). The signals can then be mixed or otherwise aggregated to form a single signal or can be considered sequentially or in parallel.

At (212) it can be determined whether the speech command has ended. For example, if received audio signals return to a baseline level or drop below a threshold volume for longer than a threshold time, then the speech command can be assumed to have ended.

If it is determined at (212) that the speech command has not ended, then method (200) can return to (210) and continue receiving the human speech command. However, if it is determined at (212) that the speech command has ended, then method (200) can proceed to (214).

At (214) any additional sensors that were activated at (208) can be de-activated.

At (216) standard operations can be resumed at the one or more surrounding devices. For example, network communication module 128 can communicate over network 150 with any devices that controlled to reduce background noise at (206) and can instruct such devices to return to standard operations.

As an example, returning to standard operations can include un-muting, un-attenuating, or otherwise return an audio output to its previous volume. As another example, returning to standard operations can include restarting or otherwise operating any components for which operation was discontinued to reduce background noise.

At (218) the speech command can be processed. For example, speech processing module 130 can process the speech command to identify one or more operations requested by the speech command. Appliance 110 can then perform the requested operations.

After (218), method (200) can return to (202) and begin again. Thus, an appliance implementing method (200) can use visual cues to identify when a user is attempting to provide a speech command. The appliance can then reduce background noise to better receive the command.

Figure 3:
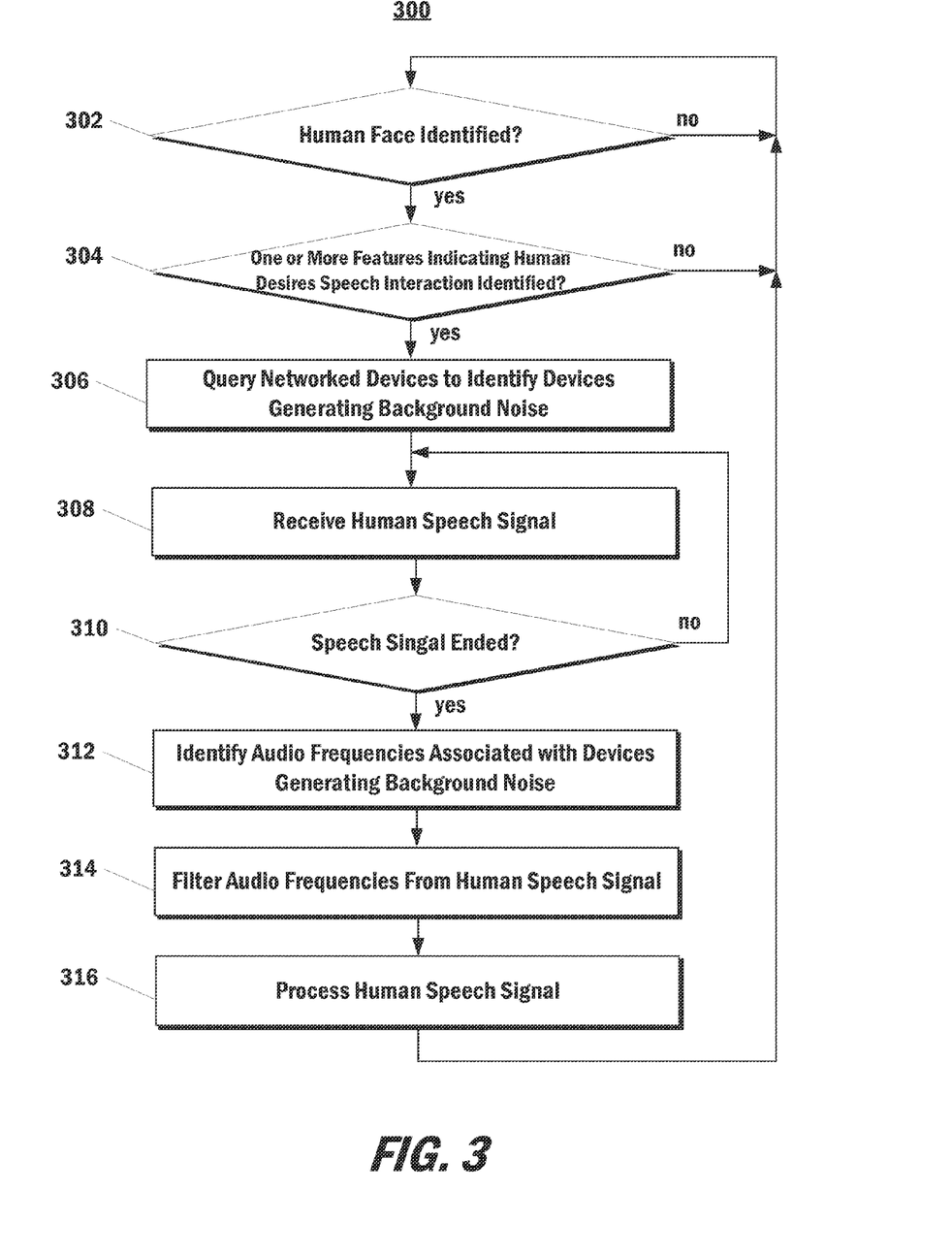
FIG. 3 depicts a flow chart of an example method of operating an appliance according to an example embodiment of the present disclosure.

FIG. 3 depicts a flow chart of an example method (300) of operating an appliance according to an example embodiment of the present disclosure. Although method (300) will be discussed with reference to system 100 of FIG. 1, method (300) can be performed by any suitable appliance system.

In addition, FIG. 3 depicts steps performed in a particular order for purposes of illustration and discussion. Those of ordinary skill in the art, using the disclosures provided herein, will understand that the various steps of method (300) can be omitted, adapted, and/or rearranged in various ways without departing from the scope of the present disclosure.

At (302) it can be determined whether a human face has been identified. For example, camera 120 can collect one or more frames of visual imagery. Feature recognition module 126 can be implemented to analyze the one or more frames of visual imagery to identify the presence or absence of human facial features.

If it is determined at (302) that a human face has not been identified, then method (300) can perform (302) again. For example, additional frames of imagery can be captured and then analyzed. However, if it is determined at (302) that a human face has been identified, then method (300) can proceed to (304).

At (204) it can be determined whether one or more features indicating that the human desires speech interaction have been identified. For example, feature recognition module 126 can analyze the frames of imagery to identify whether they contain one or more features indicating that the human desires speech interaction.

As an example, the one or more features identified at (304) can include a prolonged gaze or eye contact with the appliance. For example, if greater than a threshold number of consecutive frames of visual imagery contain human eye features then it can be assumed at (304) that the human desires speech interaction.

As another example, the one or more features identified at (304) can include moving lips of a human. Thus, if the imagery includes lip features that are moving (e.g. displaced) over a number of consecutive frames than it can be assumed that the human is speaking and therefore desires speech interaction with the appliance.

If it is determined at (304) that one or more features indicating that the human desires speech interaction have not been identified, then method (300) can return to (302). However, if it is determined at (304) that one or more features indicating that the human desires speech interaction have been identified, then method (300) can proceed to (306).

At (306) one or more networked devices can be queried to identify any devices generating background noise. For example, network communication module 128 can communicate with appliance 160, entertainment system 170, and device 180 over network 150 to determine which of such devices is operating and generating background noise.

At (308) a human speech signal can be received. For example, microphone 118 can receive an audio signal and it can be stored in memory 114.

At (310) it can be determined whether the human speech signal has ended. For example, if received audio signals return to a baseline level or drop below a threshold volume for longer than a threshold time, then the speech command can be assumed to have ended.

If it is determined at (310) that the speech command has not ended, then method (300) can return to (308) and continue receiving the human speech signal. However, if it is determined at (310) that the speech command has ended, then method (300) can proceed to (312).

At (312) one or more audio frequencies respectively associated with the devices generating background noise can be identified. For example, appliance 110 can stored in data 117 one or more audio frequencies respectively associated with one or more components of one or more networked devices. Thus, at (312) appliance 110 can access data 117 to identify the audio frequencies associated with the devices generating background noise, as determined at (306).

As an example, appliance 160 may have a fan or compressor that generates background noise having a dominant audio frequency. Thus, if at (306) appliance 110 determines that appliance 160 is operating its fan, then at (312) appliance 110 can identify the audio frequency associated with the fan.

In further embodiments, the audio frequencies associated with components that are operating may not be stored in memory but rather can be identified through an analysis, either at appliance 110 or via a server computing device over network 150, of an audio signal captured prior to or subsequent to the human speech signal.

At (314) the one or more audio frequencies identified at (312) can be filtered from the human speech signal. For example, speech processing module 130 can filter from the human speech signal the audio frequencies identified at (312). Therefore, the resulting filtered signal will more clearly reflect the human speech.

At (316) the human speech signal can be processed. For example, speech processing module 130 can process the speech command to identify one or more operations requested by the speech command. Appliance 110 can then perform the requested operations.

After (316), method (300) can return to (302) and begin again. Thus, an appliance implementing method (300) can use visual cues to identify when a user is attempting to provide a speech command. The appliance can then reduce background noise to better receive the command.

The technology discussed herein makes reference to networks, databases, software applications, and other computer-based systems, as well as actions taken and information sent to and from such systems. One of ordinary skill in the art will recognize that the inherent flexibility of computer-based systems allows for a great variety of possible configurations, combinations, and divisions of tasks and functionality between and among components. For instance, processes discussed herein may be implemented using a single processing system or multiple processing systems working in combination. Databases and applications may be implemented on a single system or distributed across multiple systems. Distributed components may operate sequentially or in parallel.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method of operating an appliance, the method comprising:
    identifying, by the appliance, one or more visual cues included in image captured by a camera of the appliance, wherein the one or more visual cues indicate that a human user of the appliance is seeking to provide a voice command to the appliance;
    determining, by the appliance, whether the human user of the appliance is seeking to provide the voice command to the appliance based at least in part on the one or more visual cues identified from the imagery, wherein the determining whether the human user of the appliance is seeking to provide the voice command to the appliance based at least in part on the one or more visual cues includes comparing, by the appliance, a number of identified visual cues to a threshold number;

upon determining that the human user seeking to providing the voice command to the appliance, communicating, by the appliance, with one or more devices over a network to reduce background noise a generated by the one or more devices, wherein the communicating includes querying the one or more devices to identify which of the devices are operating and generating the background noise and wherein the one or more devices are different than and physically separate from the appliance;

receiving, by the appliance, the voice command from the user;

determining, by the appliance, that the user has finished providing the voice command; and upon determining that the user has finished providing tile voice command, communicating, by the appliance, with the one or more devices over the network to cause the one or more visual devices to resume standard operations.

2. The method of claim 1, wherein the one or more visual cues comprise one or more visual features indicating that a face of the user is positioned in front of the appliance.

3. The method of claim 1, wherein the one or more visual cues comprises one or more visual features indicating that lips of the user are moving.

4. The method of claim 1, wherein the one or more visual cues comprises sustained eye contact from the user towards the appliance.

5. The method of claim 1, wherein the network comprises a home local area network.

6. The method of claim 1, wherein communicating, by the appliance, with the one or more devices over the network to reduce background noise generated by the one or more devices comprises sending, by the appliance, a command to the one or more devices that instructs the one or more devices to mute an audio output.

7. The method of claim 1, wherein communicating, by the appliance, with the one or more devices over the network to reduce background noise generated by the one or more devices comprises sending, by the appliance, a command to the one or more devices that instructs the one or more devices to attenuate an audio output.

8. The method of claim 1, wherein communicating, by the appliance, with the one or more devices over the network to reduce background noise generated by the one or more devices comprises sending, by the appliance, a command to the one or more devices that instructs the one or more devices to discontinue operating one or more components that generate noise.

9. The method of claim 8, wherein the one or more components comprise one of a fan or a compressor.

10. The method of claim 1, further comprising:
upon determining that the human user is seeking to provide the voice command to the appliance, activating, by the appliance, one or more additional sensors located adjacent to a position of the user;
wherein receiving, by the appliance, the voice command from the user by the appliance, the one or more additional sensors to receive the voice command.

11. The method of claim 10, wherein:
the one or more additional sensors are located in the one or more devices;
activating, by the appliance, the one or more additional sensors comprises communicating, by the appliance, with the one or more devices over the network to activate the one or more additional sensors; and
using, by the appliance, the one or more additional sensors to receive the voice command comprises receiving, by the appliance over the network, one or more audio signals captured by the one or more additional sensors.

12. A system comprising:
a camera for capturing visual imagery;
a microphone;
a processor; and
a memory, storing instructions that, when executed by the processor, cause the appliance to perform operations, the operations comprising:
analyzing the visual imagery to identify one or more visual cues included in the visual imagery, wherein the one or more visual cues indicate that a human user of the appliance is attempting to provide the appliance with a voice command;
determining, when the human user is attempting to provide the appliance with the voice command based at least in part on the one or more visual cues identified from the visual imagery, wherein the determining when the human user is attempting to provide the appliance with the voice command includes comparing, by the appliance, a number of consecutive frames that include the one or more visual cues to a threshold number of frames;
when it is determined that the user is attempting to provide the appliance with the voice command, communicating with the one or more devices over the network to cause the one or more devices to decrease a volume of an audio output that the one or more devices are respectively outputting, wherein the communicating includes querying the one or more devices to identify which of the devices are operating and outputting the audio output;
after communicating with the one or more devices over the network to cause the one or more devices to decrease the volume of an audio output the one or more devices are respectively outputting, receiving the voice command from the user;
determining that the user has finished providing the voice command; and
upon determining that the user has finished providing the command, communicating with the one or more devices over tile network to cause the one or more devices to return the volume of their respective audio outputs to a previous level.

13. The system of claim 12, wherein analyzing the visual imagery to identify one or more visual cues included in the visual imagery comprises identifying the one or more visual feature that indicate one or more of the following:
that a face of the user is positioned in front of the camera;
that lips of the user arc moving; or
that eye contact from the user towards the appliance has been established for a period of time.

14. An appliance comprising:
a camera for capturing visual imagery;
a microphone;
one or more processors; and one or more non-transitory computer-readable media that store instructions that, when executed by the one or more processors, cause the appliance to perform operations, the operations comprising:

analyzing the visual imagery to identify one or more visual cues included in the visual imagery, wherein the one or more visual cues indicate that a human user of the appliance is attempting to provide the appliance with a voice command;

determining when the human user is attempting to provide the appliance with the voice command based at least in part on the one or more visual cues identified from the visual imagery, wherein the determining when the human user is attempting to provide the appliance with the voice command includes determining whether the one or more visual cues include a sustained eye contact from the human user toward the appliance or a lip feature that is moving over number of frames;

when it is determined that the user is attempting to provide the appliance with the voice command, querying one or more devices over a network to identify one or more devices that are generating a background noise, wherein the one or more devices are different than and physically separate from the appliance;

communicating with the one or more device over the network to cause the one or more devices to respectively reduce the background noise generated by the one or more devices;

after communicating with the one or more devices over the network to cause the one or more devices to respectively reduce the background noise generated by the one or more devices, receiving the voice command from the user;

determining that the user has ceased providing the voice command; and upon determining that the user has ceased providing the voice command, communicating with the one or more devices over the network to cause the one or more devices to resume standard operations.

15. The appliance of claim 14, wherein communicating with the one or more devices over the network to cause the one or more devices to respectively reduce the background noise generated by the one or more devices comprises instructing the one or more devices over the network to discontinue operating one or more components that are generating the background noise.

16. The appliance of claim 14, wherein communicating with the one or more devices over the network to cause the one or more devices to resume standard operations comprises instructing the one or more devices over the network to resume operating the one or more components that are generating background noise.

* * * * *

UNITED STATES PATENT AND TRADEMARK OFFICE
CERTIFICATE OF CORRECTION

PATENT NO. : 9,477,217 B2
APPLICATION NO. : 14/198770
DATED : October 25, 2016
INVENTOR(S) : William Everette Gardner Page 1 of 1

It is certified that error appears in the above-identified patent and that said Letters Patent is hereby corrected as shown below:

In the Claims

In Line 53, Column 10, "tile" should read "the";

In Line 61, Column 10, "arc" should be "are";

In Line 22, Column 12, Claim 16 should depend from Claim 15.

Signed and Sealed this
Tenth Day of September, 2019

Andrei Iancu
*Director of the United States Patent and Trademark Office*